(12) United States Patent
Bouten et al.

(10) Patent No.: US 8,598,787 B2
(45) Date of Patent: Dec. 3, 2013

(54) PERMEATION BARRIER ON FLEXIBLE DEVICE

(75) Inventors: Petrus Cornelis Paulus Bouten, Eindhoven (NL); Fredericus J. Touwslager, Veldhoven (NL)

(73) Assignee: Creator Technology B.V., Breda (NL)

(*) Notice: Subject to any disclaimer, the term of this patent is extended or adjusted under 35 U.S.C. 154(b) by 157 days.

(21) Appl. No.: 12/438,672

(22) PCT Filed: Aug. 21, 2007

(86) PCT No.: PCT/NL2007/050411
§ 371 (c)(1),
(2), (4) Date: May 19, 2009

(87) PCT Pub. No.: WO2008/023980
PCT Pub. Date: Feb. 28, 2008

(65) Prior Publication Data
US 2010/0264817 A1    Oct. 21, 2010

Related U.S. Application Data

(60) Provisional application No. 60/823,392, filed on Aug. 24, 2006.

(51) Int. Cl.
*H01J 1/70* (2006.01)
(52) U.S. Cl.
USPC .......................... 313/506; 313/509; 313/512
(58) Field of Classification Search
USPC ................. 313/498–512; 428/690–691, 917; 438/26–29, 34, 82; 257/40, 72, 257/98–100, 642–643, 759; 427/66, 427/532–535, 539
See application file for complete search history.

(56) References Cited

U.S. PATENT DOCUMENTS

| | | | | |
|---|---|---|---|---|
| 4,593,228 A * | 6/1986 | Albrechtson et al. | ......... | 313/509 |
| 4,745,334 A * | 5/1988 | Kawachi | ......... | 313/512 |
| 4,902,929 A * | 2/1990 | Toyoda et al. | ......... | 313/503 |
| 4,967,117 A * | 10/1990 | Yoshioka et al. | ......... | 313/506 |
| 5,003,222 A * | 3/1991 | Washo | ......... | 313/511 |
| 5,354,497 A | 10/1994 | Fukuchi et al. | | |
| 5,757,126 A * | 5/1998 | Harvey et al. | ......... | 313/506 |
| 5,811,177 A * | 9/1998 | Shi et al. | ......... | 428/209 |
| 6,219,127 B1 | 4/2001 | Hirakata et al. | | |
| 6,424,401 B1 | 7/2002 | Kang et al. | | |
| 6,628,070 B2 * | 9/2003 | Van Den Reek et al. | ......... | 313/512 |

(Continued)

FOREIGN PATENT DOCUMENTS

JP    06258621 A    9/1994

OTHER PUBLICATIONS

International Search Report for PCT/NL2007/050411 dated Feb. 8, 2008.

*Primary Examiner* — Anh Mai
*Assistant Examiner* — Fatima Farokhrooz

(57) ABSTRACT

A display device includes a first electrode formed on a first substrate, and a second electrode formed on a second substrate. An electro-optical material is sandwiched between the first and second electrodes. A protective layer has a first section formed over the second substrate, a second section formed over the first substrate, and a third section formed between the first and second sections. The third section conforms to the shape of sides of the electro-optical material, the second electrode, and the second substrate.

5 Claims, 3 Drawing Sheets

(56) References Cited

U.S. PATENT DOCUMENTS

| | | | |
|---|---|---|---|
| 6,652,994 B2 * | 11/2003 | Yanagita et al. | 428/690 |
| 6,744,199 B1 * | 6/2004 | Tanaka | 313/512 |
| 6,833,668 B1 * | 12/2004 | Yamada et al. | 313/505 |
| 7,071,618 B2 * | 7/2006 | Ishikawa et al. | 313/509 |
| 7,190,115 B2 * | 3/2007 | Tsuchiya et al. | 313/512 |
| 7,278,760 B2 * | 10/2007 | Heuser et al. | 362/293 |
| 7,459,220 B2 * | 12/2008 | Hikmet et al. | 428/690 |
| 2002/0067126 A1 * | 6/2002 | Van Den Reek et al. | 313/512 |
| 2003/0113581 A1 * | 6/2003 | Gotou | 428/690 |
| 2003/0184689 A1 | 10/2003 | Lude | |
| 2004/0125320 A1 | 7/2004 | Bouten | |
| 2005/0242720 A1 * | 11/2005 | Sano et al. | 313/506 |
| 2006/0022592 A1 * | 2/2006 | Boroson | 313/512 |

* cited by examiner

PERMEATION BARRIER ON FLEXIBLE DEVICE

FIELD OF THE INVENTION

The present invention relates to display devices having a permeation barrier to provide a seal.

BACKGROUND

Flexible displays including rollable displays are expected to become more common place. Basically, flexible or rollable displays may be manufactured using a variety of display elements, e.g. Liquid Crystal Display (LCD) elements or Organic Light Emitting Display (OLED) elements, deposited on or sandwiched between flexible substrates, e.g. polymer substrates. Light emitting polymers offer various advantages such as excellent viewing angle and contrast, as well as low power consumption. Flexible passive matrix monochrome organic light emitting displays (OLEDs) have been demonstrated by U.S. and Far East companies, such as Pioneer, Dai Nippon, UDC, and DuPont Displays.

Generally, an OLED comprises an organic display element which is deposited on a base glass substrate and covered by an exit substrate. One of the critical issues for Organic Light Emitting Devices (OLEDs) is their lifetimes, which is largely limited by the degradation of the organic light emitting material induced by water and oxygen permeating into the display. Other displays and display effects are sensitive to water (and/or oxygen). For this reason, significant attention is paid to encapsulate the display appropriately. In flat panel displays, for example, appropriate encapsulation is achieved dominantly with the glass substrates. For flexible/rollable display applications, thin brittle layers are applied as permeation barrier, either directly on the display devices or parts thereof (thin film packaging) or on the (polymer) carrier substrates.

In addition to tightly encapsulating the display element(s), in order to provide for a fluid (gas or liquid) tight sealed environment, the front and back substrates are joined together by a seal(s) impermeable to water and/or oxygen. Furthermore, the displays are usually assembled in inert gas conditions, in order to eliminate any contamination from being contained in the display. However, there is always a risk that some trace amounts of oxygen or water remain in the display cell and/or the seals are not impermeable enough to moisture and gas. Therefore, packaging of polyLED devices deposited on glass currently involves gluing a rigid lid with getter on the glass substrate, which absorbs excess water and or gaseous substances in the display. However, even with the use of getter, there is still a need for displays that are highly impermeable and well sealed from the environment, such as high or low humidity and temperature conditions, as well as sealed to keep out oxygen, where humidity and oxygen tend to degrade the displays and reduce their useful lifetimes. Accordingly, there is a need for better displays or display cells which are better sealed and protected against the environment or exchange of fluids.

SUMMARY OF THE INVENTION

One object of the present systems and methods is to overcome the disadvantage of conventional displays, such as flexible and/or rollable displays.

This and other objects are achieved by displays and methods of forming thereof comprising a first electrode formed on a first substrate and a second electrode formed on a second substrate. An electro-optical material is sandwiched between the first and second electrodes. A protective layer has a first section formed over the second substrate, a second section formed over the first substrate, and a third section formed between the first and second sections. The third section conforms to the shape of sides of the electro-optical material, the second electrode, and the second substrate.

Further areas of applicability of the present systems and methods will become apparent from the detailed description provided hereinafter. It should be understood that the detailed description and specific examples, while indicating exemplary embodiments of the displays and methods, are intended for purposes of illustration only and are not intended to limit the scope of the invention.

BRIEF DESCRIPTION OF THE DRAWINGS

These and other features, aspects, and advantages of the apparatus, systems and methods of the present invention will become better understood from the following description, appended claims, and accompanying drawing where:

DETAILED DESCRIPTION OF THE DRAWINGS

The following description of certain exemplary embodiment(s) is merely exemplary in nature and is in no way intended to limit the invention, its application, or uses. In the following detailed description of embodiments of the present systems, devices and methods, reference is made to the accompanying drawings which form a part hereof, and in which are shown by way of illustration specific embodiments in which the described devices and methods may be practiced. These embodiments are described in sufficient detail to enable those skilled in the art to practice the presently disclosed systems and methods, and it is to be understood that other embodiments may be utilized and that structural and logical changes may be made without departing from the spirit and scope of the present system.

The following detailed description is therefore not to be taken in a limiting sense, and the scope of the present system is defined only by the appended claims. The leading digit(s) of the reference numbers in the figures herein typically correspond to the figure number, with the exception that identical components which appear in multiple figures are identified by the same reference numbers. Moreover, for the purpose of clarity, detailed descriptions of well-known devices, circuits, and methods are omitted so as not to obscure the description of the present system.

Figure 1:
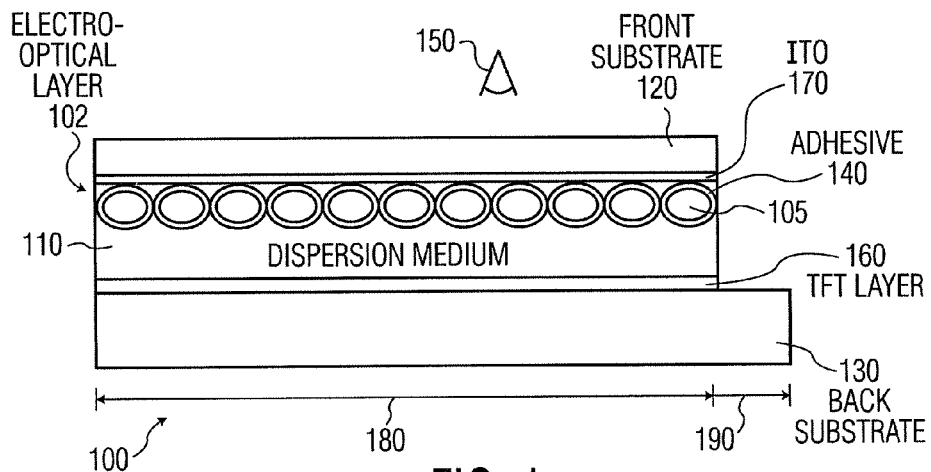
FIG. 1 shows a conventional display device.

FIG. 1 shows a cross-sectional geometry of a conventional electro-optical cell, such as an electrophoretic cell 100 for a display device, such as flexible and rollable displays. Illustratively, conventional electrophoretic cells are described in U.S. Pat. No. 6,906,851 to Yuasa, and U.S. Patent Application Publication No. 2005/0179852 to Kawai, each of which is incorporated herein by reference in its entirety. The electrophoretic cell 100, which may have a thickness of approximately 100 μm or less, includes an electro-optical material layer 102, such as encapsulated electrophoretic particles 105 dispersed in a liquid-phase dispersion medium 110 sandwiched between two substrates, namely front and back substrates 120, 130. The electrophoretic particles 105 may be held in desired positions by an adhesive 140 surrounding all or part of the particles 105, for example.

The substrates 120, 130, if rigid, may be a ceramic material such as glass, alumina or quartz, or metallic material, such as aluminum, titanium or stainless steel. At least one of the substrates 120, 130 is transparent. For flexible substrates, plastic material may be used such as a polycarbonate or a polyester, for example, polyethylene terephthalate (PET), polyethylene naphthalate (PEN), etc., as well as polyethylene (PE), polystyrene (PS), polypropylene (PP), polycarbonate (PC), polyetheretherketone (PEEK), polyethersulfone (PES), polyetherimide (PEI) and the like. Of course, reinforced plastic substrates may also be used, such as plastic covered flexible metal or ceramic substrates including meshes for example, as obtained by molding a plastic material into a desired shape with a filler of a metal or ceramic material. Illustratively, the front substrate or front plane 120, i.e., the substrate that is viewed by a viewer 150, may be made from PET and have a thickness of also approximately 25 µm; while the back substrate or back plane 130 may be made from PEN and have a thickness of approximately 25 µm.

As is well known, pixel electrodes, such as a matrix of TFT-electrodes (i.e., thin film transistor electrodes) 160 may be formed over the back plane 130 which may also include a connection pad and inter-connective wiring/buses for connecting the electrodes to further external circuits, such as through a via formed in the backplane 130, as described in U.S. Pat. No. 7,075,703 to O'Neil et al., and International Publications Number WO 2005/103808 to Makubo et al., each of which is incorporated herein by reference in its entirety. Illustratively, the TFT-electrode layer 160, including interconnections and other circuits such as drivers or the like, may have a thickness of approximately 3-10 µm. Further, a common transparent electrode, such as an indium-tin-oxide (ITO) layer 170 is formed over the front substrate 130, thus sandwiching the electro-optical layer 102 and forming an active display area 180.

Both the ITO layer 170 on the front substrate 120 and the geometry of the TFT layer or the polymer electronics layer/stack 160 may significantly lower the water permeation rate towards the water-sensitive layers in the display cell. The various layers may be formed or laminated to each other as is well known, such as described in above noted U.S. Pat. No. 7,075,703 to O'Neil.

Figure 2:
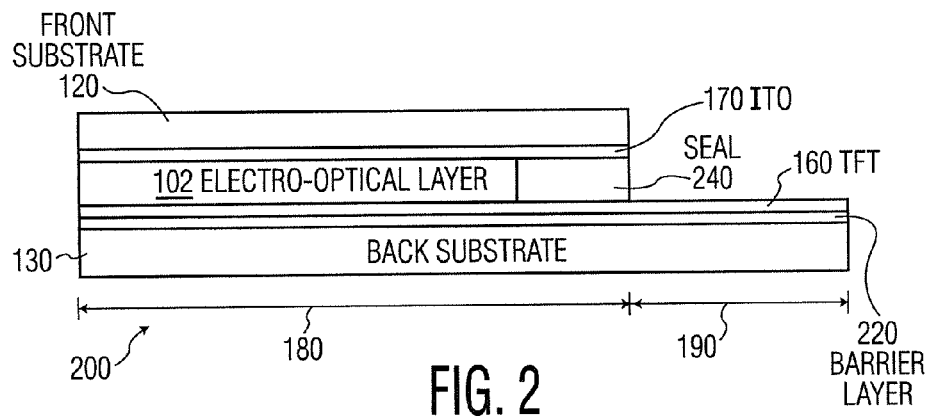
FIGS. 2-6 show display devices according to various embodiments.

As shown in the display device or cell 200 of FIG. 2, a significant lifetime increase of flexible or rollable display devices is achieved by the application of a hermetic layer 220 on the back substrate 130 before the application of the polymer electronics stack 160. The hermetic layer 220 may be inorganic materials, like flexible metals, oxides, nitride or multi-layer stacks of these materials, for example, where pressure, bonding, and/or soldering may be used, as described in U.S. Pat. No. 6,816,226 to Bouten which is incorporated herein by reference in its entirety. To prevent edge-diffusion and thus display characteristics/lifetime degradation, a flexible adhesive seal 240 is filled in a gap located between the front and back substrates 120, 130 as shown in the display device or cell 200 of FIG. 2. Alternatively, a gap may be formed between a protective layer 410 and the back substrate 130 where the gap is filled with an edge seal, as will be described in connection with FIG. 4.

However, typically, forming a clean gap to be filled with the edge seal 240 includes cleaning side edges of the common ITO electrode 170 and side edges of the electro-optical material layer 102, to remove excess electro-optical material layer 102, for example. Such a cleaning of edges may cause local damage to other layers or to the cleaned ITO electrode 170 and electro-optical material layers 102 themselves, thus creating short diffusion paths and undesirably increasing permeability.

Figure 3:
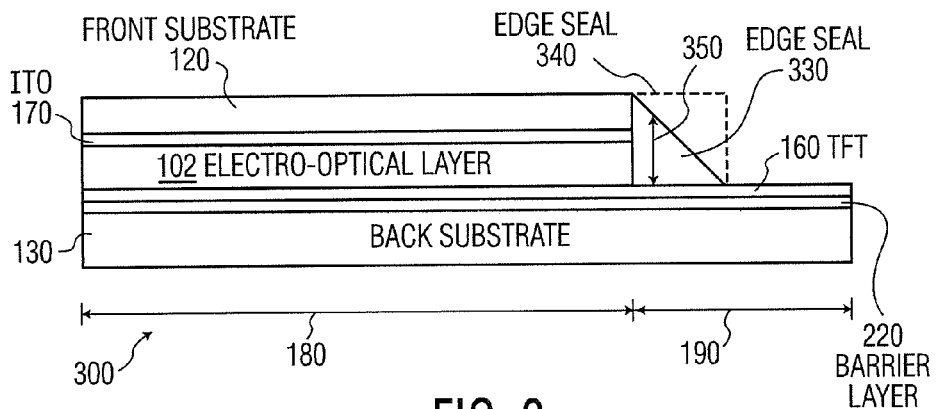

As, shown in FIG. 3 for a display cell 300, instead of forming a gap and filling it with the edge seal, a flexible adhesive seal 330 is applied around the side edges of the electro-optical layer 102 and side edges of the front substrate 120. The adhesive seal 330 is formed on the back substrate 130 in the inactive zone 190. FIG. 3 shows a tapered adhesive seal 330 sloping downward from the front substrate 120 towards the back substrate 130 in the inactive zone 190. That is, the height 350 of the tapered adhesive seal 330 decreases moving away from the cell or active zone 180. However, the edge seal height 350 may be uniform, such as being substantially equal to the height of the electro-optical layer 102 plus the height of the front substrate 120, resulting in a uniform height edge seal 340 shown by the dashed lines in FIG. 3. Illustratively, various flexible organic materials may be used for the seal having various characteristics and impermeability, such as those available from the German company Delo Industrie Klebstoffe (Delo). Other seal material may be thermally-curable or UV-curable epoxies, hybrid epoxies and arcylates, for example.

Figure 4:
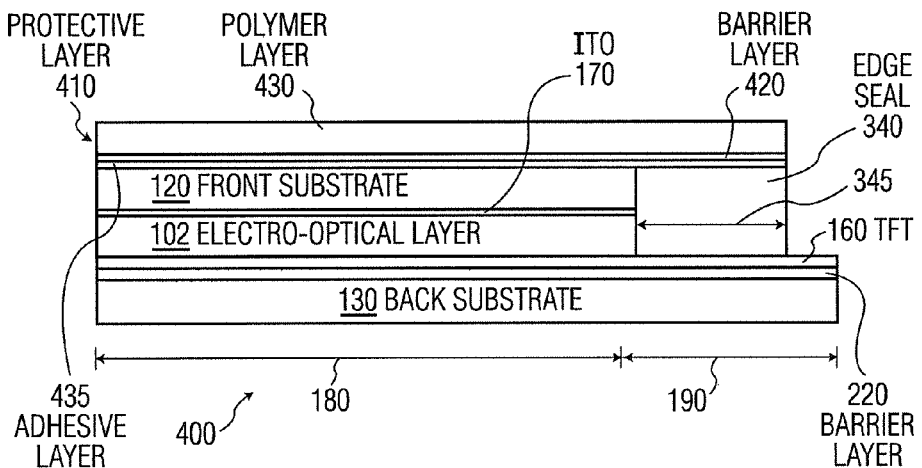

As shown in FIG. 4, to further extend the display device lifetime and further protect against permeation of fluid (gas and/or liquid), such as water or oxygen for example, a flexible display cell 400 has a protective layer 410 which is formed over the front substrate 120 and the edge seal 340 having a height substantially similar to the combined heights of the electro-optical layer 102 and front substrate 120. As described in connection with FIG. 3, the adhesive edge seal 340 informed on the back substrate 130 in the inactive zone 190.

The edge seal 340, instead of being formed directly on the back substrate 130, is formed on the hermetic barrier layer 220 which is first formed over the back substrate 130. In the active zone 180, the TFT layer or the polymer electronics layer/stack 160 is formed on the hermetic barrier layer 220. If desired, the polymer electronics layer 160 may extend over the back substrate 130 in the inactive zone 190, in which case, the edge seal 340 is formed over the polymer electronics layer 160 located in the inactive zone 190.

The protective layer 410 (formed over the edge seal 340 and front plane 120) further improves display characteristics and lifetime, and reduces fluid/vapor permeation rate including sealing short diffusion paths. Illustratively, the protective layer 410 is thin having a thickness of less than 50 µm, or even less than 30 µm. The protective layer 410 includes a transparent hermetic barrier layer 420 formed on a transparent polymer carrier 430. A transparent adhesive layer 435 is then applied to the barrier layer 420, and the three-layer stack 420, 430, 435 is then laminated on top of the display cell 400, namely, laminated on the front substrate 120 and the edge seal 340. Illustratively, the hermetic barrier layer 420 is an inorganic barrier material such as AlOx deposited on the polymer (e.g., PET) film 430, where the hermetic barrier layer 420 includes at least one of the following: oxide, nitride, oxide-nitride combination or multi-layer organic-inorganic stack.

The seal line or edge seal 340 along with the protective layer 410 surrounds and encapsulates the side and front surfaces of the active area 180 of the cell or display device 400. Illustratively, the seal line 340 is of limited width 345, e.g., approximately 0.2 mm to 10 mm wide. The edge seal adhesive 340 (which is formed on the back substrate 130, the hermetic barrier layer 220 or the electronics layer 160 in the inactive zone 190,) significantly limits fluid (e.g., water or oxygen) permeation at the cell edge.

Figure 5:
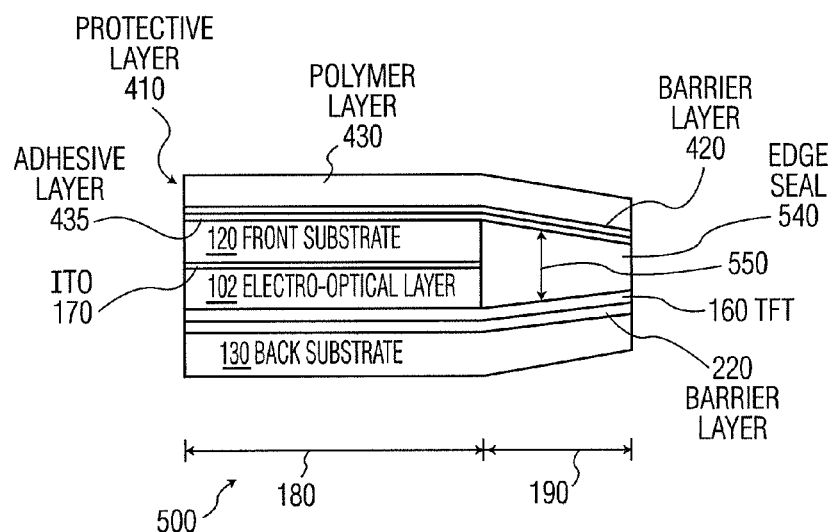

Instead of the edge seal 340, in another embodiment of a display 500 shown in FIG. 5, a tapered edge seal 540 is formed. The tapered edge seal 540 has a decreasing height 550 in the direction away from the electrophoretic laminate layer 102, i.e., towards outside of the electro-optical cell 500. Although FIG. 5, shows that both (top and bottom) surfaces of the edge seal 540 may be tapered, it should be understood that only one of the (top or bottom) surfaces of the edge seal 540 may be tapered. Having a tapered edge seal 540 lowers the bending stiffness and the shear forces at the edge. As is well known in the art, various material may be used for the edge seal 340, 540, having any desired stiffness to reduce the chance of delamination failure, such as those provided by Delo and/or described in above noted U.S. Pat. No. 6,816,226 to Bouten, as well as described in U.S. Patent Application Publication No. 2006/0139555 to Janssen et al., which is incorporated herein by reference in its entirety.

Similar to that described in connection with FIG. 4, the three-layer stack 420, 430, 435 that forms the protective layer 410 is laminated over the edge seal 540. As noted, the various layers may be formed by various methods, such as bonding, laminating, chemical vapor deposition (CVD) and/or plasma enhanced chemical vapor deposition (PECVD), as described in International Publications Number WO 2006/014591 to Berland et al., which is incorporated herein by reference in its entirety.

Of course if desired, instead of forming the edge seal 340, 540 first and then forming or laminating thereon the protective layer 410, the protective layer 410 may be formed first extending beyond the front substrate 120 thus forming a gap between itself (i.e., the protective layer 410) and the back substrate 130. The gap may be tapered using spacers, which may then be removed to form a tapered gap, tapered at one or both top and bottom portions. The gap (whether tapered or not) is then filled with a sealing material to form the edge seal 340, 540 as described in above noted U.S. Pat. No. 7,075,703 to O'Neil, U.S. Pat. No. 6,816,226 to Bouten, and U.S. Patent Application Publication No 2006/0139555 to Janssen et al.

It should be noted that unlike the display cell described in U.S. Pat. No. 7,075,703 to O'Neil having an edge seal directly on the back substrate, the edge seal 340, 540 of the display devices or cells (shown in FIGS. 4-5) may be formed on the hermetic barrier layer 220 which is first formed over the back substrate 130, then the TFT layer or the polymer electronics layer/stack 160 is formed. Instead of the edge seal 340, 540 being formed directly over the hermetic barrier layer 220, the edge seal 340, 540 may be formed over the polymer electronics layer 160 in the case where the electronics layer 160 extends beyond the active area, as shown in FIGS. 4-5. As described, the hermetic barrier layer 420 is formed over the edge seal 340, 540; that is, the edge seal is formed between two hermetic barrier layers 220, 420. To maintain the flexibility of the cell, the total cell thickness is limited. For example, it is desirable that the thicknesses of each of the two substrates 120, 130 and the protective layer 410 be less than 30 μm each. Illustratively, the total thickness of the display cell is less than 150 μm to allow for desired rollability. If only flexibility is needed, the display cell may be thicker.

Figure 6:
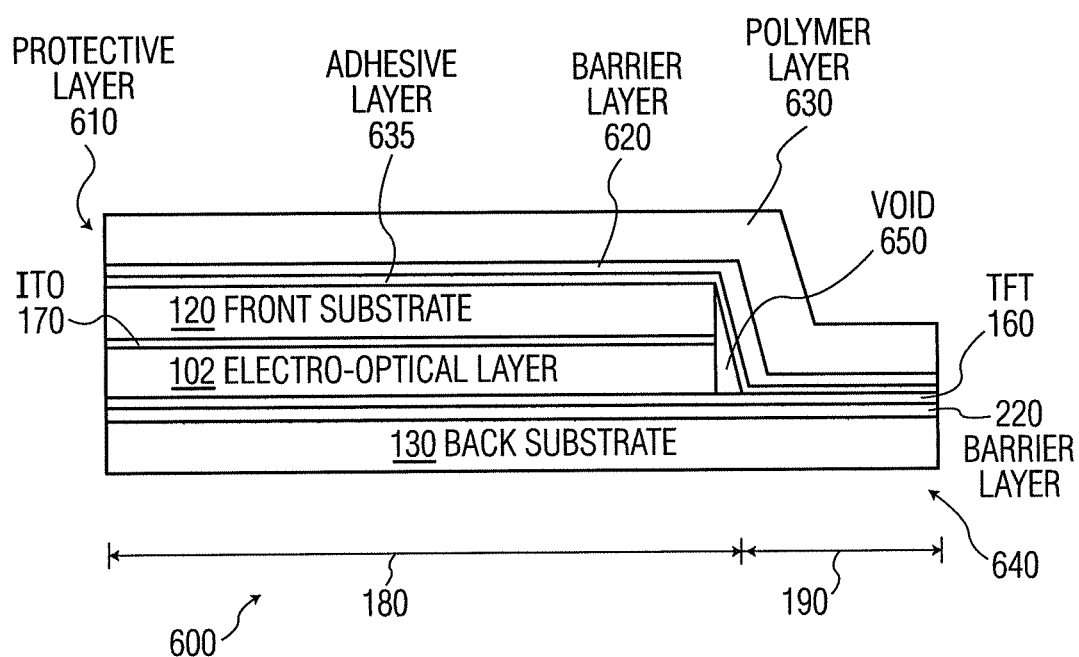

FIG. 6 shows another embodiment of an electro-optic cell 600 for a flexible or rollable display device. In this embodiment, instead of an edge seal sealing edges of the electro-optical material layer 102 and the front substrate 120, and protective layer 410 covering the front substrate 120 and edge seal (330, 340, 540 of FIGS. 4-5), a conformal protective layer 610 is formed over the front substrate 120, side edges of the front substrate 120 and the electro-optical material layer 102, and end portions 640 of the back substrate 130 located in the inactive zone 190 extending beyond active zone 180 including the electro-optical material layer 102.

As shown in FIG. 6, the conformal protective layer 610 includes a transparent polymer foil 630 and a barrier layer 620 formed thereon, where a transparent adhesive layer 635 is provided on the barrier layer 620 for form a three-layer stack similar to that described above. The three-layer stack 630, 620, 635 forming the protective layer 610 is then laminated on top of the complete display 600, thus sealing the front substrate 120, side edges of the front substrate 120 and the electro-optical material layer 102, and the back substrate end portions 640. Thus, instead of the edge seals 330, 340, 540 shown in FIGS. 3-5, the side edges of the front substrate 120 and the electro-optical material layer 102 are sealed by the protective layer 610 substantially conformally over, or conforming to the shape of, the front substrate 120, side edges of the front substrate 120 and the electro-optical material layer 102, and the back substrate end portions 640. The protective layer 610 is applied or laminated after the front and back substrate 120, 130 are put together, and over the front substrate 120, in order to compensate for any height differences among different layers, or surface variation of one layer or adjoining layers.

As shown in FIG. 6, a small void 650 may be formed at the edge of the electrophoretic material 102 upon lamination of protective sheet 610. In such a case, the void 650 may be mechanically a weak spot, so it is advantageous to fill this void 650 with flexible material. Illustratively, the void 650 is filled with an adhesive, e.g., material available from Delo. It should be noted that the material filling the void need not provide an edge seal. That is, unlike the cells shown in FIGS. 4-5 where edge seals 340, 540 are formed, the material filling the void is primarily for providing strength instead of providing an edge seal.

The conformal protective layer 610 allows for use and formation of thinner sheets or layers, such as less than 25 microns. Further, the conformal protective layer 610 dispenses with the need for a separate edge seal, and provides an improved seamless seal and protection against permeation through the front substrate 120 and sides thereof, including the sides of the electro-optical material layer 102. Of course, the side edges of the conformal protective layer 610 may be substantially vertical (i.e., substantially conform to the cell's edge, i.e., the side edges of the front substrate 120 and electro-optical material layer 102), instead of being slightly sloping away from the cell's edge as shown in FIG. 6, and may have a uniform thickness or be slightly thicker at bends thereof.

Of course, it is to be appreciated that any one of the above embodiments or processes may be combined with one or with one or more other embodiments or processes to provide even further improvements in finding and matching users with particular personalities, and providing relevant recommendations.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the broader and intended spirit and scope of the present system as set forth in the claims that follow. The specification and drawings are accordingly to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same or different item(s) or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise; and h) no specific sequence of acts or steps is intended to be required unless specifically indicated.

The invention claimed is:

1. A display device comprising:
   a first flexible substrate;
   a first electrode formed on said first flexible substrate;
   a second flexible substrate, having a first surface facing said first flexible substrate, and a second surface opposite to said first surface, wherein the first flexible substrate and the second flexible substrate are selected from a group consisting of polyester, polyethylene terephthalate (PET), polyethylene naphthalate (PEN), polyethylene (PE), polystyrene (PS), polypropylene (PP), polycarbonate (PC), polyetheretherketone (PEEK), polyethersulfone (PES), and polyetherimide (PEI);
   a second electrode formed on said second flexible substrate;
   an electro-optical material sandwiched between said first electrode and said second electrode;
   a protective layer having a first section formed over said second surface of said second flexible substrate, a second section formed over said first flexible substrate, and a third section formed between said first section and said second section, wherein said third section conforms to a shape of sides of said electro-optical material, of said second electrode, and of said second flexible substrate, wherein said protective layer includes a barrier layer formed on and covering a polymer foil;
   an adhesive layer bonding said protective layer to said first flexible substrate end portion, said sides of said electro-optical material and of said second electrode, and said second flexible substrate; and
   a flexible material filled into a void between said side of said electro-optical material and said adhesive layer.

2. The display device of claim 1, further comprising a hermetic barrier layer formed between said first flexible substrate and said first electrode.

3. The display device of claim 1, wherein said second flexible substrate is a front substrate configured to be viewed by a viewer.

4. A method of forming a display device comprising the acts of:
   forming a first electrode on a first flexible substrate;
   forming a second electrode on a second flexible substrate having a first surface facing said first flexible substrate and a second surface opposite to said first surface, wherein the first flexible substrate and the second flexible substrate are selected from a group consisting of polyester, polyethylene terephthalate (PET), polyethylene naphthalate (PEN), polyethylene (PE), polystyrene (PS), polypropylene (PP), polycarbonate (PC), polyetheretherketone (PEEK), polyethersulfone (PES), and polyetherimide (PEI);
   forming an electro-optical material sandwiched between said first electrode and said second electrode;
   forming a protective layer having a first section formed over said second surface of said second flexible substrate, a second section formed over said first flexible substrate, and a third section formed between said first section and said second section, wherein said third section conforms to a shape of sides of said electro-optical material, of said second electrode, and of said second flexible substrate, wherein said protective layer includes a barrier layer formed on and covering a polymer foil;
   forming an adhesive layer bonding said protective layer to said first flexible substrate end portion, said sides of said electro-optical material and of said second electrode, and said second flexible substrate; and
   filling a flexible material into a void between said side of said electro-optical material and said adhesive layer.

5. The method of claim 4, further comprising the step of forming a hermetic barrier layer between said first flexible substrate and said first electrode.

* * * * *